United States Patent [19]

Axman

[11] 4,088,956

[45] May 9, 1978

[54] AUTOMATIC MODULATION PERCENTAGE CONTROL FOR AMPLITUDE MODULATED TRANSMITTERS

[76] Inventor: Michael P. Axman, 714 Christian Ave., Elkhart, Ind. 46514

[21] Appl. No.: 662,280

[22] Filed: Feb. 27, 1976

[51] Int. Cl.² .............................................. H04B 1/04
[52] U.S. Cl. .................................... 325/159; 325/144; 332/39
[58] Field of Search ............... 325/144, 159, 187, 133; 332/39, 38

[56] References Cited

U.S. PATENT DOCUMENTS

| 2,235,339 | 3/1941 | Stewart | 325/144 |
| 2,941,162 | 6/1960 | Cotellessa et al. | 332/39 |
| 2,957,147 | 10/1960 | Cotellessa et al. | 332/39 |
| 2,984,796 | 5/1961 | Affelder | 332/39 |
| 3,320,536 | 5/1967 | Lockwood | 325/144 |

Primary Examiner—Robert L. Richardson
Assistant Examiner—Tommy P. Chin

[57] ABSTRACT

An automatic modulation percentage control for amplitude modulated transmitters wherein a percentage detection circuit responsive to a sample signal from the transmitter and functioning at a selected modulation percentage generates a gain-reduction bias for a gain control amplifier supplying the transmitter. The percentage detection circuit compares a reduced DC component with the unattenuated AC component of the sample signal.

7 Claims, 5 Drawing Figures

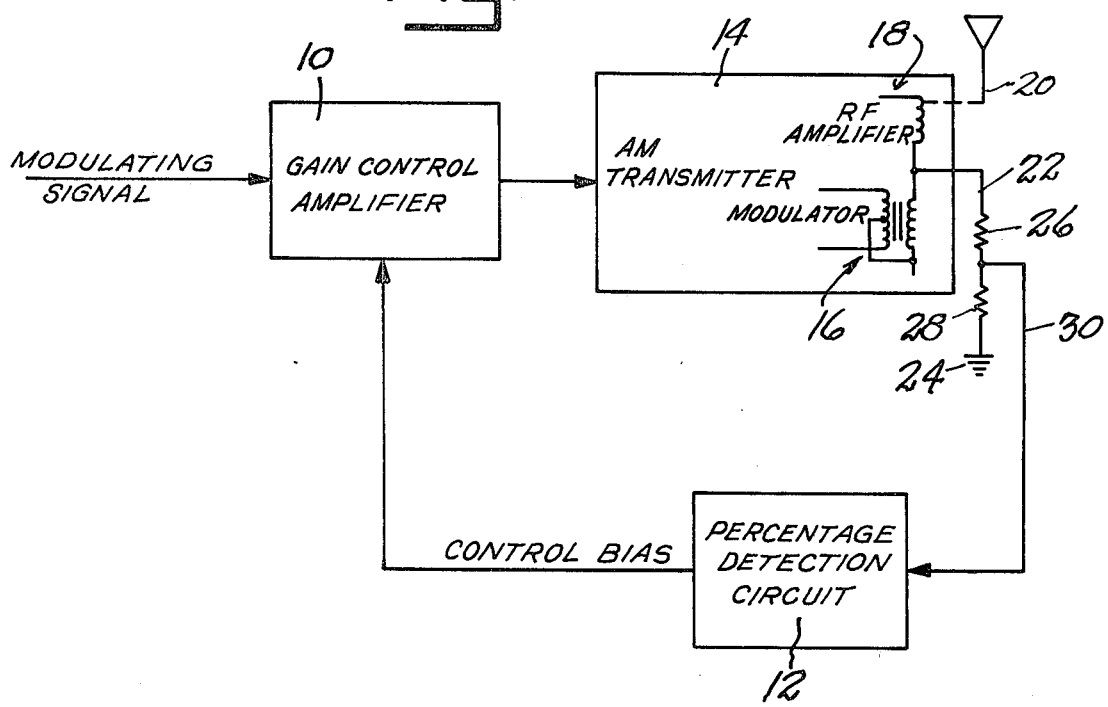
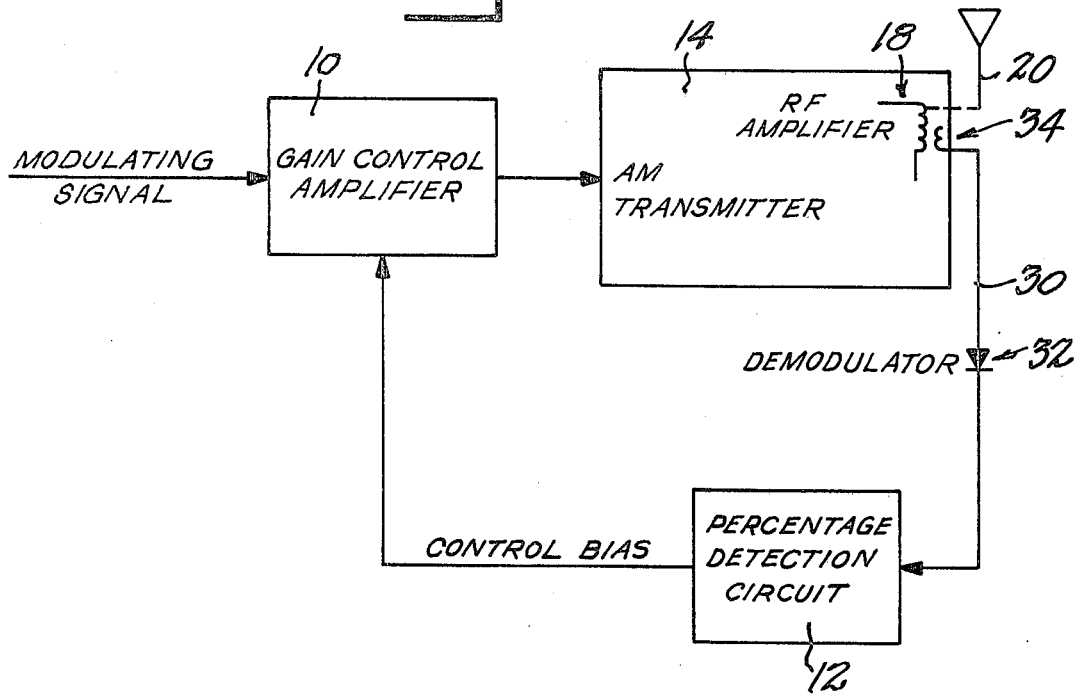

BASIC MODULATION PERCENTAGE
DETECTION CIRCUIT FOR NEGATIVE
MODULATION PEAKS

BASIC MODULATION PERCENTAGE
DETECTION CIRCUIT FOR POSITIVE
MODULATION PEAKS

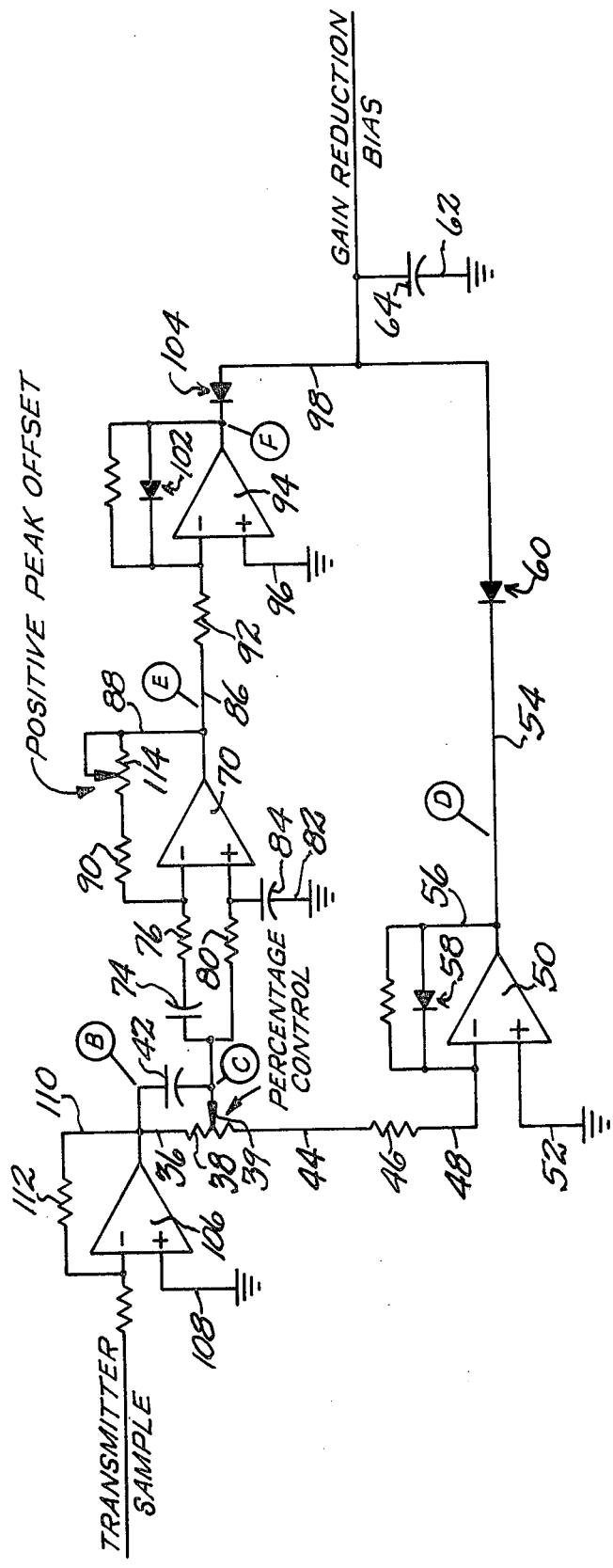

AUTOMATIC MODULATION PERCENTAGE CONTROL FOR AMPLITUDE MODULATED TRANSMITTERS

SUMMARY OF THE INVENTION

This invention relates to an automatic modulation percentage control for amplitude modulated transmitters. It is common practice to employ automatic level control devices to regulate the magnitude of a modulating signal applied to amplitude modulated transmitters for radio and video transmission before that signal is applied to the modulator stages of the transmitter. The accuracy with which such a system can control modulation percentage is limited to the constancy of the relationship between the modulating input signal level and the modulation index. In such systems the accuracy is limited by variables existing within the transmitter.

The effectiveness of an amplitude modulated radio transmitter in conveying information is related to the modulation percentage. Sideband power varies as the square of the modulation percentage. Thus a transmitter modulated 70% has about one-half the sideband power as when modulated 100%, and one modulated 60% has 36% of the sideband power, etc.

The relative loudness of the received signal, the signal-to-noise ratio, and the effective range of a transmitting station are all related to the modulation index of the transmitter. Thus a high level of modulation is desirable. However, overmodulation, especially in the negative direction, is undesirable. Thus, negative modulation in excess of 100% can cause interference to other stations and is prohibited by government regulation.

The present practice in the employment of automatic level control devices entails application of a signal of constant peak amplitude to the input of the transmitter. Thus present systems are subject to overmodulation.

It is the primary object of this invention to provide accurate automatic control of the modulation index of an amplitude modulated transmitter to maintain a high level of modulation while preventing overmodulation.

A further object is to provide a system which samples the output of a transmitter in terms of modulation percentage and automatically makes corrections for levels over or under a predetermined modulation percentage threshhold.

A further object is to provide a system wherein factors within the transmitter which tend to change the input level requirement for the transmitter, such as variations in RF loading and AC mains fluctuations, are within the control loop of the system and are compensated.

A further object is to provide a system utilizing as basic components a gain control amplifier, an amplitude modulated transmitter, and a modulation percentage detection circuit.

Other objects will be apparent from the following specification.

In the drawings:

FIG. 1 is a block diagram of a modulation percentage control system with sampling from a modulated RF amplifier power supply.

FIG. 2 is a block diagram of a modulation percentage control system with RF sampling of a modulated RF stage.

FIG. 5 is a wiring diagram illustrating a modulation percentage detection circuit incorporating circuits similar to those shown in FIGS. 3 and 4.

Figure 3:
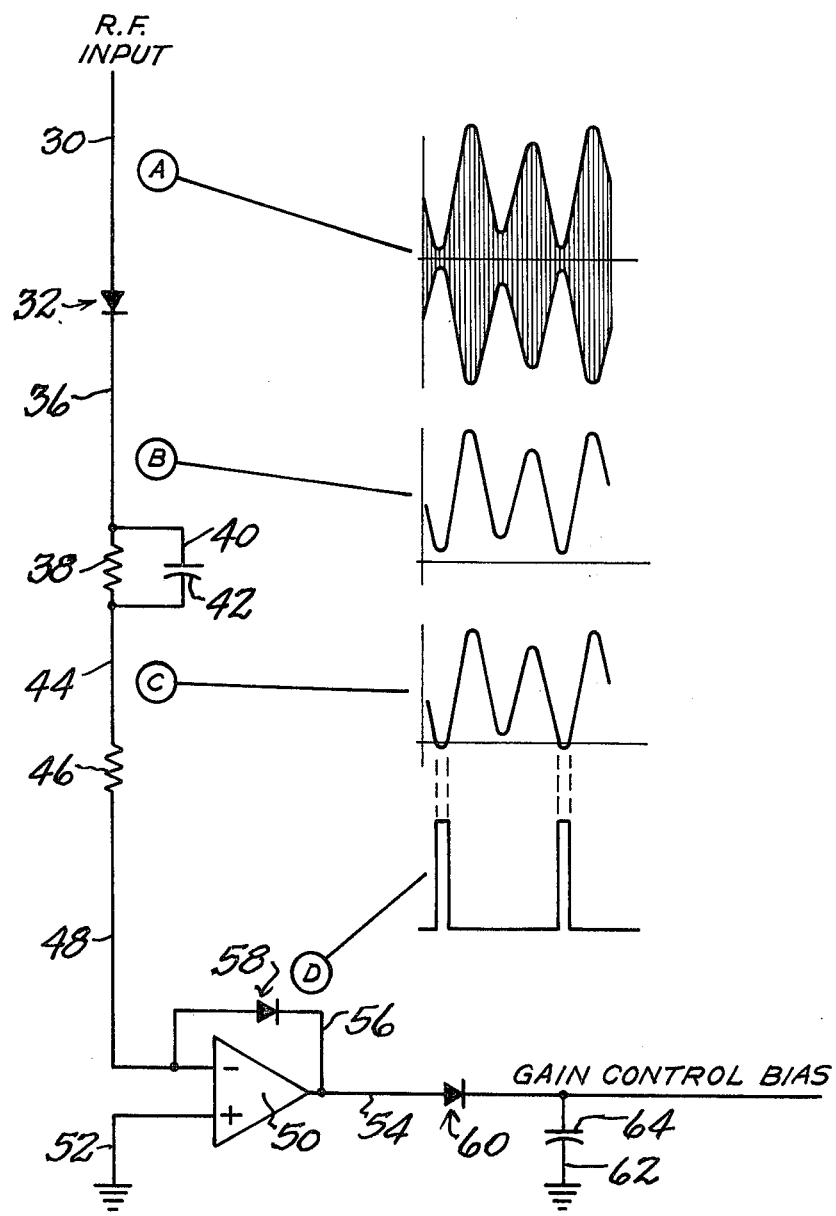
FIG. 3 is a wiring diagram of a basic modulation percentage detection circuit for negative modulation peaks, with correlated schematic illustrations of signals at different points in the circuit.

My improved automatic modulation percentage control utilizes a modulation percentage detection circuit which compares the alternating current (AC) and direct current (DC) components of a demodulated sample of the radio frequency (RF) output of the transmitter, or a sample of the modulated plate (or collector) supply voltage or current, and generates gain-reduction bias for a gain-control amplifier at a precise modulation percentage threshold. The accuracy of the detection circuit is relatively independent of the level of the RF sample, inasmuch as it senses the ratio of the voltage components, rather than absolute values. The modulation index is related to the ratio of the AC and DC and is equal to the DC voltage divided by the instantaneous value of the AC voltage (positive or negative). At 100% modulation, the two values are equal.

The depth of modulation to be detected may be selected by reducing the DC component by a factor equal to a selected or desired modulation index and comparing this reduced DC component with the unattenuated AC component. For example, if the DC component is reduced to 85% of its original value, it will be equal in value to the peak of the AC component at 85% modulation. This condition of equality can be detected by a comparator circuit and used to generate gain-reduction bias.

FIG. 1 is a block diagram illustrating a modulation percentage control system wherein sampling occurs at the modulated RF amplifier power supply. In this circuit, a modulating signal is supplied to a gain-control amplifier 10 to which is also supplied a control bias derived from a percentage detection circuit 12, and is supplied to amplitude modulated transmitter 14 having a modulator circuit or component 16 and a radio frequency amplifier component 18 supplying or transmitting to the transmitter output 20. The percentage detection circuit 12 is connected with the transmitter 14 by a sampling lead 22 connected in a line between the modulator 16 and the RF amplifier 18. Lead 22 is grounded at 24 and has interposed therein a pair of resistors 26 and 28. A lead 30 branches from lead 22 between the resistors 26 and 28 and supplies the sample to the percentage detection circuit 12. FIG. 2 is a block diagram wherein the modulation percentage control system samples the demodulated RF envelope of the amplitude modulated transmitter. In FIG. 2, parts similar to those in FIG. 1 bear the same reference numerals. In FIG. 2 an inductive or other coupling means 34 with the RF amplifier 18 of the AM transmitter 14 feeds the percentage detection circuit 12 through the lead 30.

The device provides for detection of both negative modulation peaks and positive modulation peaks. In such detection the composite AC and DC voltage of the sampled transmitter output, either the demodulated RF components sampled as illustrated in FIG. 2 or the modulated plate (collector) supply as illustrated in FIG. 1, are applied to a comparator circuit. For percentage thresholds or determinations other than 100%, the DC component is modified relative to the unattenuated AC component. Any circuit that will alter the ratio between the AC component and the DC component may be employed.

FIG. 3 illustrates a basic percentage detection circuit for the detection of negative modulation peaks. The radio frequency signal of the sampled transmitter output in lead 30 is demodulated by diode 32 and lead 36 extends from the demodulating diode to a resistor 38. A lead 40 bypassing the resistor 38 includes a capacitor 42 in parallel to the resistor 38. Lead 44 connects resistor 38 and capacitor 42 with a resistor 46, from which in turn extends a lead 48 connected to operational amplifier 50 having a lead 52 extending to ground. The amplifier output is delivered by lead 54. A lead 56 connects leads 48 and 54 in parallel to amplifier 50 and includes a diode 58. Lead 54 has interposed therein a diode 60 and may be connected to ground by a lead 62 in which is interposed a capacitor 64.

The characteristics of the signal at different points in the circuit are schematically illustrated in the figure. Thus the signal from the RF sample in lead 30 is designated at A. The demodulated signal as it occurs at lead 36 is illustrated at B. The DC component of the signal as reduced by resistor dividers 38, 46 at lead 44 is illustrated at C, in which case the lower end of the resistor 46 is at virtual ground. One or both of resistors 38 and 46 may be variable, if desired. The capacitor 42 is of sufficient capacitance to have negligible AC voltage drop at the lowest modulating frequency.

The modulation index (m) at which C will be driven to zero volts is determined by the ratio of the resistances 38 and 46 and may be expressed as $m = R2/(R1 + R2)$, where $R1$ is resistor 38 and $R2$ is resistor 46. This modulation percentage threshhold will be quite accurate if the source impedance of the sample and the input offset voltage of the comparator can be neglected. The diode 58 serves to keep the lower end of resistor 46 at virtual ground.

For modulation peaks exceeding the threshhold, the output of amplifier 50 swings positive, and the diode 60 conducts, charging the capacitor 64. Pulses are thus integrated by capacitor 64 providing a DC control bias which is used for gain reduction of the gain-control amplifier. The signal at the output of amplifier 50 is designated schematically at D.

Figure 4:
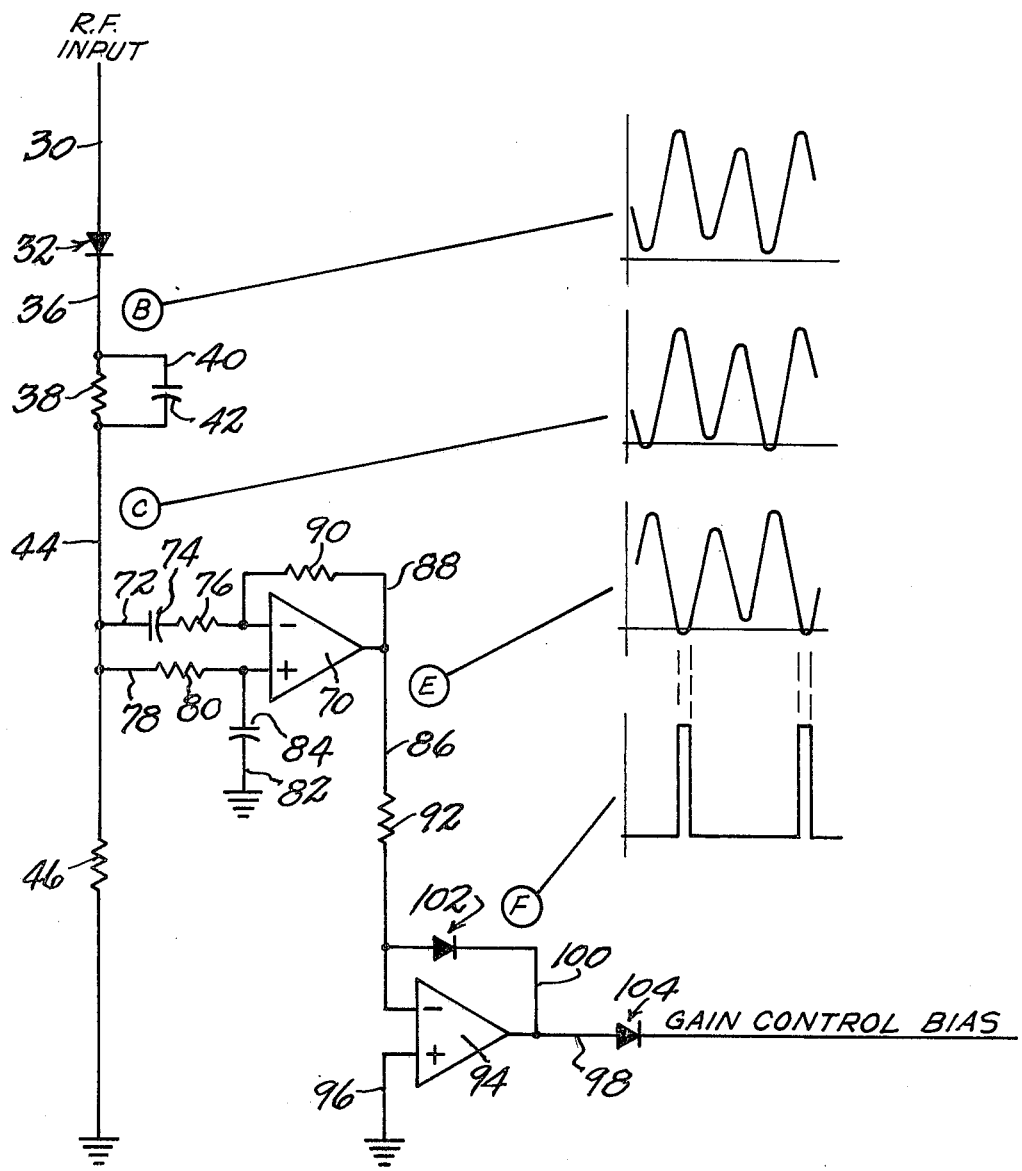
FIG. 4 is a wiring diagram showing a basic modulation percentage detection circuit for positive modulation peaks, with correlated schematic illustrations of signals at different points in the circuit.

FIG. 4 illustrates a basic modulation percentage detection circuit for positive modulation peaks. In this circuit the AC and DC components of the sample may be separated, the DC component being modified by a factor equal to the modulation index threshhold, and then the two compared in a comparator circuit. The input circuitry including lead 30, diode 32, lead 36, resistor 38, capacitor 42 in lead 40, lead 44 and resistor 46, may be that of the negative peak detector circuit illustrated in FIG. 3. The signal produced at lead 36 is illustrated at B and that at lead 44 is illustrated at C, and these may be similar to the signals occurring at similar points in the circuit illustrated in FIG. 3. An amplifier 70 of inverting unity gain type for the AC component, but a non-inverting unity gain type for the DC component, is connected at lead 44 by a lead 72 having interposed therein a capacitor 74 and a resistor 76. Amplifier 70 is also connected to lead 44 by a lead 78 having interposed therein a resistor 80. Lead 78 is connected to ground by a lead 82 having a capacitor 84 interposed therein. The output of amplifier 70 is delivered to lead 86. A lead 88 connects leads 72 and 86 in parallel with the amplifier 70 and has interposed therein a resistor 90.

Lead 86 has interposed therein a resistor 92 and is connected to an amplifier 94 which also is connected to ground lead 96. A lead 98 is connected at the output terminal of the amplifier 94. A lead 100 connects leads 86 and 98 and has interposed therein a diode 102 in parallel to the amplifier 94. The output lead 98 has a diode 104 interposed therein and delivers the desired gain control bias. The signal characteristic at the output of the amplifier 70 is illustrated diagrammatically at E, and the signal at the output of amplifier 94 is illustrated diagrammatically at F. It will be noted that the output voltage wave form at E resembles that at C except that the polarity of the AC component is reversed. Also it will be noted that the output voltage wave form as detected by the comparator amplifier 94 constitutes the positive modulation peaks. Also, in this circuit the diode 102 holds the input voltage to the comparator amplifier 94 at virtual ground, similarly to the function of diode 58 relative to the amplifier 50 illustrated in the circuit of FIG. 3.

FIG. 5 illustrates a practical modulation percentage detection circuit 12 which incorporates circuits for detecting both negative and positive modulation peaks. In this circuit, parts similar to those illustrated in the circuits in FIGS. 3 and 4 bear the same reference numerals. Voltage polarities in the illustration are, however, inverted from those shown in FIGS. 2 and 3. The circuit in FIG. 5 includes an operational amplifier 106 for a transmitter sample which is connected to ground at 108. A branch lead 110 includes a resistor 112 in parallel to amplifier 106, the output of which is connected to lead 36. Either a sample of demodulated RF from the transmitter or a sample of the modulated supply from the transmitter RF power amplifier may be supplied to the input connection of operational amplifier 106. The operational amplifier 106 provides a low source impedance for the detection circuits. It will be understood, however, that the provision of an operational amplifier 106 is optional and is used in cases where a low source impedance is desirable and serves to ensure a low source impedance in the circuit. In cases where operational amplifier 106 is not employed, connections to the transmitter sample point may be made, as through a lead 30 and diode 32 as illustrated in FIGS. 3 and 4.

The percentage of control for which the circuit of FIG. 5 is determined by the setting of the variable contact 39 on resistor 38. The AC component of the transmitter sample is fed to the amplifier 70 through capacitor 74 and resistor 76, while the DC component is fed through the branch of the circuit including the resistor 80. The DC component remains constant while the amplifier 70 acts as a phase invertor for the AC component producing the wave form illustrated at E in FIG. 4.

The wave forms at points B, C, D, E and F in the circuit of FIG. 5 are illustrated schematically in FIGS. 3 and 4 with voltage polarities reversed.

The percentage control illustrated as variable by the variable resistor 38, 39 in FIG. 5 is optional, and a fixed percentage control may be provided in the circuit as illustrated in FIGS. 3 and 4, wherein the ratio of the values of resistors 38 and 46 will provide or determine the control at the selected modulation percentage. A variable resistor 114 in lead 88 parallel to amplifier 70 in series with a fixed resistor 90 provides a positive peak offset control which allows the AC gain of the amplifier 70 to be adjusted to less than unity. In such a case, the positive peak threshhold will be at a higher modulation percentage than the negative.

While the preferred embodiment of the invention has been illustrated and described, it will be understood that changes in the circuit may be made within the scope of the appended claims without departing from the spirit of the invention.

What I claim is:

1. In an automatic modulation percentage control for an amplitude modulated radio frequency transmitter having input terminals for the application of a modulating signal voltage,
   means for sampling the output of the transmitter,
   a modulation percentage detection circuit for comparing the alternating current AC and direct current DC components of the output sample, said alternating current and direct current components being proportional to modulation and average carrier level respectively, said detection circuit generating a gain control bias voltage at a selected modulation percentage threshold,
   a gain control amplifier responsive to said control bias, the output of said gain control amplifier being connected to the input of the transmitter and controlling the magnitude of the modulating voltage at said input terminals.

2. The combination defined in claim 1,
   wherein said modulation percentage detection circuit reduces the DC component of the output sample to a selected degree and compares the reduced DC component with the unattenuated AC component of the output sample.

3. An automatic modulation percentage control as defined in claim 1, including
   a resistive divider for reducing the DC component of the output of the sampling means to a selected degree, whereby said reduced DC component is compared to an unattenuated peak amplitude of the AC component of said sample.

4. The combination defined in claim 1, wherein said AC and DC components are derived from a modulated plate voltage of said radio transmitter.

5. The combination defined in claim 1, wherein said AC and DC components are derived from a demodulated sample of the radio frequency output of a transmitter.

6. The combination defined in claim 1, wherein said AC and DC components are derived from the supply voltage or current of a modulated radio frequency amplifier.

7. A modulation percentage detector comprising
   a circuit for detecting negative modulation peaks in a sample of the output of a radio frequency transmitter,
   means comparing said negative peaks with the magnitude of the average carrier output of the transmitter,
   a circuit for detecting positive modulation peaks in a sample of the output of said transmitter,
   and means comparing said positive peaks with the magnitude of the average carrier output of the transmitter, whereby a gain-reduction bias at a selected modulation percentage threshhold is generated and applied to control the level of the modulating signal at the input of the transmitter.

* * * * *